United States Patent [19]
Maeda

[11] Patent Number: 5,285,417
[45] Date of Patent: Feb. 8, 1994

[54] SEMICONDUCTOR MEMORY DEVICE HAVING BREAKER ASSOCIATED WITH ADDRESS DECODER CIRCUIT FOR DEACTIVATING DEFECTIVE MEMORY CELL

[75] Inventor: Keita Maeda, Kanagawa, Japan

[73] Assignee: NEC Corporation, Tokyo, Japan

[21] Appl. No.: 723,158

[22] Filed: Jun. 28, 1991

[30] Foreign Application Priority Data

Jun. 29, 1990 [JP] Japan .................... 2-171474

[51] Int. Cl.$^5$ .................... G11C 7/00; G11C 29/00
[52] U.S. Cl. .................... 365/200; 365/96; 365/230.06; 371/11.1
[58] Field of Search .................... 365/96, 200, 230.06; 371/11.1

[56] References Cited

U.S. PATENT DOCUMENTS

| | | | |
|---|---|---|---|
| 4,587,638 | 5/1986 | Isobe et al. | 365/200 |
| 4,720,817 | 1/1988 | Childers | 365/200 |
| 4,985,866 | 1/1991 | Nakaizumi | 365/200 |
| 4,987,560 | 1/1991 | Hamano et al. | 365/200 |

Primary Examiner—Siegfried H. Grimm
Attorney, Agent, or Firm—Sughrue, Mion, Zinn, Macpeak & Seas

[57] ABSTRACT

A semiconductor memory device comprises regular memory cells arranged in rows and columns, word lines respectively coupled to the rows of the regular memory cells, a row address decoding circuit responsive to external address bits for designating one of the word lines, word line driving circuits respectively associated with the word lines and driving one of the word lines under the control of the row address decoding circuit, and a row of redundant memory cells with which one of the rows of the regular memory cells is replaced upon discovering a defective memory cell incorporated therein, wherein breakable elements are coupled between the row address decoding circuit and the word line driving circuits and one of the breakable elements associated with the row with the defective memory cell is broken so that any data bit is never read out from the defective memory cell even if the external address bits designate the defective memory cell.

5 Claims, 2 Drawing Sheets

SEMICONDUCTOR MEMORY DEVICE HAVING BREAKER ASSOCIATED WITH ADDRESS DECODER CIRCUIT FOR DEACTIVATING DEFECTIVE MEMORY CELL

FIELD OF THE INVENTION

This invention relates to a semiconductor memory device and, more particularly, to a breaker unit coupled between an address decoder circuit and a word line driving unit associated with a defective memory cell for deactivating the defective memory cell.

DESCRIPTION OF THE RELATED ART

A typical example of the semiconductor memory device is illustrated in FIG. 1, and largely comprises a memory cell array MA1, an address input buffer circuit 1, a redundant word line selecting circuit 2, a word line deactivation circuit 3, a row address decoding circuit 4, a word line driving circuit 5, a redundant word line driving circuit 6, and a delay circuit 7. The memory cell array MA1 contains redundant memory cells RC1, RC2 and RCn and regular memory cells MC1m, MC12, MC1n, MCm1, MCm2 and MCmn which are arranged in rows and columns. The redundant memory cells RC1 to RCn are coupled to a redundant word line RWL, and the rows of the regular memory cells MC11 to MCmn are coupled to word lines WL1 to WLm, respectively. The columns of the regular memory cells MC11 to MCmn and the redundant memory cells RC1 to RCn are coupled to digit line pairs DL1, DL2 and DLn which in turn are coupled through a column selecting circuit (not shown) to an output data circuit (not shown).

The address input buffer circuit 1 is supplied with external row address bits Ax1 to Axk, and produces internal address signals Ix1 to Ixk as well as complementary address signals Cx1 to Cxk. The internal address signals Ix1 to Ixk and the complementary address signals Cx1 to Cxk are supplied through the delay circuit 7 to the row address decoding circuit 4, and the row address decoding circuit 4 consists of two-input NAND gates NA1 to NA4 and inverting circuits IN1 to IN4 coupled to the output nodes of the two-input NAND gates NA1 to NA4. The internal address signals Ix1 to Ixk and the complementary address signals Cx1 to Cxk are selectively supplied to the two-input NAND gates NA1 to NA4.

The complementary address signals Cx1 to Cxk are directly distributed to a programming circuit 2a of the redundant word line selecting circuit 2 as well as to a programming circuit 3a of the word line deactivation circuit 3. The programming circuit 2a is coupled to two-input NAND gate 2b, and the two-input NAND gate 2b drives the redundant word line RWL with two inverting circuits IN5 and IN6 of the redundant word line driving circuit 6. The word line deactivation circuit 3 further comprises a two-input NOR gate 3b, an inverting circuit 3c, and a plurality of two-input NAND gates 3d1 to 3dm respectively associated with word lines WL1 to WLm. The programming circuit 3a monitors the complementary address signals Cx1 to Cxk to see whether or not the redundant memory cells RC1 to RCn are to be accessed. If the programming circuit 3a finds that the external address bits Ax1 to Axk are indicative of the address assigned to the redundant memory cells RC1 to RCn, the NOR gate 3b causes the inverting circuit 3c to shift a controlling signal to a low voltage level, and all of the NAND gates 3d1 to 3dm produce respective output signals of a high voltage level. Since inverting circuits 5a1 to 5am and 5b1 to 5bm of the word line driving circuit 5 invert the output signals of NAND gates 3d1 to 3dm, all of the word lines remain in the inactive low voltage level. Moreover, the programming circuit 2a supplies output signals of the low voltage level, and NAND gate 2b produces an output signal of the high voltage level. As a result, the redundant word line driving circuit 6 drives the redundant word line RWL to the active high voltage level.

Description is made on the circuit behavior on the assumption that the external row address bits Ax1 to Axk=(1 ... 1) are indicative of the row of the regular memory cells MCm1 to MCmn replaced with the redundant memory cells RC1 to RCn. If the external row address bits Ax1 to Axk are (0 ... 0), the address input buffer circuit 1 produces the internal address signals Ix1 to Ixk of (0 ... 0) and the complementary address signals Cx1 to Cxk of (1 ... 1). The internal address signals Ix1 to Ixk and the complementary address signals Cx1 to Cxk are supplied in parallel to the programming circuit 2a, the delay circuit 7 and the programming circuit 3a. The programming circuit 2a produces the output signals of the low voltage level, and, accordingly, the NAND gate 2b produces the output signal of the high voltage level. Then, the redundant word line driving circuit 6 allows the redundant word line RWL to remain in the low voltage level, and no redundant memory cell RC1 to RCn supplies any data bit to the associated digit line pair DL1 to DLn. The programming circuit 3a produces the output signals of the high voltage level, and, accordingly, the NOR gate 3b produces the output signal of low voltage level. Then, the inverting circuit 3c shifts the controlling signal CTL1 to the high voltage level, and, for this reason, the NAND gates 3d1 to 3dm are enabled. The delay circuit 7 retards the internal address signals Ix1 to Ixk and the complementary address signals Cx1 to Cxk, and the internal address signals Ix1 to Ixk and the complementary address signals Cx1 to Cxk are, then, decoded by the row address decoding circuit 4. With the complementary address signals Cx1 to Cxk of logic "1" level, the NAND gate NA1 produces the output signal of the high voltage level, then the inverting circuit IN1 supplies a decoded signal of the low voltage level to the NAND gate 3d1. The NAND gate 3d1 yields the output signal of the low voltage level, and the word line driving circuit 5 drives the word line WL1 to the high voltage level. With the high voltage level on the word line WL1, the regular memory cells MC11 to MC1n concurrently turn on to supply data bits to the associated digit line pairs DL1 to DLn. Thus, an external device can access the data bits memorized in regular memory cells MC11 to MC1n with the external row address bits Ax1 to Axk (0 ... 0).

On the other hand, if the external address bits Ax1 to Axk of (1 ... 1) are fed to the address input buffer circuit 1, the address input buffer circuit 1 produces the internal address signals Ix1 to Ixk of (1 ... 1) and the complementary address signals Cx1 to Cxk of (0 ... 0). The complementary address signals Cx1 to Cxk of (0 .. . 0) cause the programming circuit 2a to produce the output signals of high voltage level, and the NAND gate 2b yields the output signal of the voltage level. Then, the redundant word line driving circuit 6 drives the redundant word line RWL to the high voltage level, and data bits are read out from the redundant memory cells RC1 to RCn to the associated digit line pairs DL1 to DLn, respectively. The programming circuit 3a produces the output signals of the low voltage level, and the NOR gate 3b yields the output signal of the high voltage level. Then, the inverting circuit 3c inverts the controlling signal CTL1 to the low voltage level. With the controlling signal CTL1 of the low voltage level, all of the NAND gates 3d1 to 3dm are not enabled, and any decoded signal of the row address decoding circuit 4 can not cause the NAND gates 3d1 to 3dm to produce the output signal of the low voltage level. Then, no word line is driven to the active high voltage level.

However, there is a trade-off between an access speed and reliability of data bit read out therefrom. In detail, a delay time period between the application of the external row address bits Ax1 to Axk and production of the controlling signal CTL1 is dominated by the address input buffer circuit 1, the programming circuit 3a, the NOR gate 3b and the inverting circuit 3c, and the decoded signal is dominated by the address input buffer circuit 1, the delay circuit 7 and either NAND gate NA1, NA2, NA3 or NA4, and either inverting circuit IN1, IN2, IN3 or IN4. If the time delay circuit 7 is not taken into account, the decoded signal is produced before the controlling signal CTL1, and a data bit is read out from the defective memory cells incorporated in the row of regular memory cells MCm1 to MCmn. The external device suffers from the error data bits, and the prior art semiconductor memory device is low in reliability. While the delay circuit 7 introduces time delay not large enough to disenable the NAND gates 3d1 to 3dm with the controlling signal CTL1, the defective memory cell in the row of regular memory cells MCm1 to MCmn is apprehended to be accessed. If, on the other hand, the delay circuit 7 introduces a large amount of time delay, the controlling signal CTL1 surely reaches the NAND gates 3d1 to 3dm before the decoded signal, however, the prior art semiconductor memory device is low in access speed.

Another problem inherent in the prior art semiconductor memory device is complex circuit arrangement. As described hereinbefore, the delay circuit 7 and the word line deactivation circuit 3 are necessary for the prior art semiconductor memory device, however, these circuits 7 and 3 make the circuit arrangement of the prior art semiconductor memory device complex.

SUMMARY OF THE INVENTION

It is therefore an important object of the present invention to provide a semiconductor memory device which is free from access to a defective memory cell without sacrifice of access speed.

It is another important object of the present invention to provide a semiconductor memory device which is simple in arrangement.

To accomplish these objects, the present invention proposes to couple a breaker unit between a row address decoding unit and a word line driving unit.

In accordance with the present invention, there is provided a semiconductor memory device fabricated on a single semiconductor chip, comprising: a) a plurality of regular memory cells arranged in rows and columns and storing data bits, respectively; b) a plurality of word lines respectively coupled to the rows of regular memory cells and selectively driven to an active level so as to allow data bits to be read out from the regular memory cells of the associated row; c) a word line designating unit responsive to external address bits and producing a decoded signal for designating one of the plurality of word lines; d) a word line driving unit having a plurality of word line driving circuits respectively associated with the word lines, and driving one of the plurality of word lines designated by the decoded signal to the active level; e) at least one row of redundant memory cells coupled to a redundant word line and capable of storing data bits, respectively, one of the rows of regular memory cells being replaced with at least one row of redundant memory cells when the aforesaid one of the rows of regular memory cells contains a defective memory cell; f) a programming unit to check whether or not the aforesaid one of the rows of regular memory cells is to be accessed, the programming unit producing a first controlling signal upon an access to the aforesaid one of the rows of regular memory cells; g) a redundant word line driving unit responsive to the first controlling signal, and driving the redundant word line to the active level for allowing the data bits to be read out from at least one row of the redundant memory cells; and h) a breaker unit having a plurality of breakable elements provided in association with the plurality of driving circuits, respectively, and coupled between the word line designating unit and the plurality of word line driving circuits, one of the breakable elements associated with the aforesaid one of the rows of regular memory cells being broken so as to electrically isolate the associated word line driving circuit from the word line designating unit.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 1:
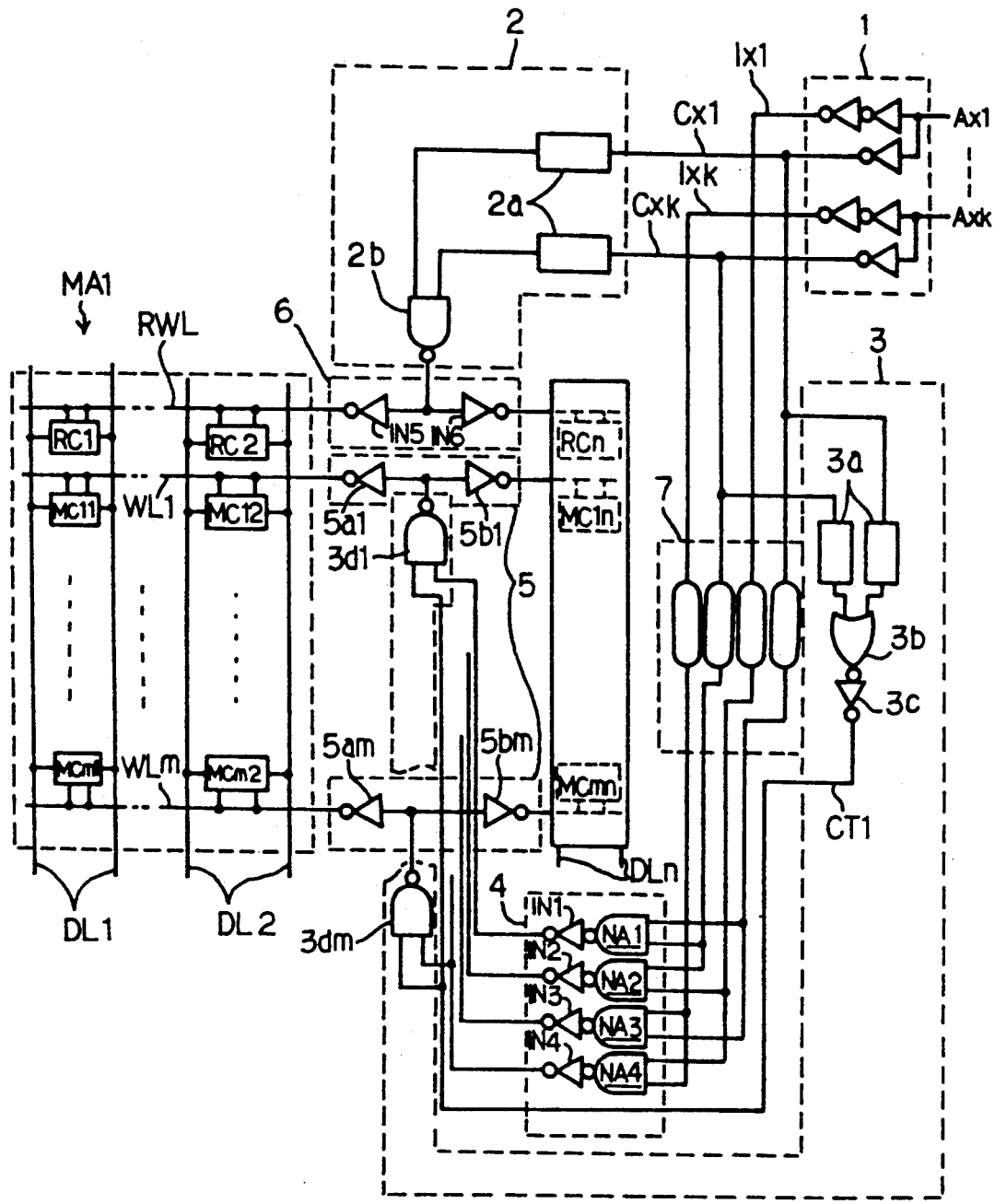
FIG. 1 is a circuit diagram showing the arrangement of the prior art semiconductor memory device.
Figure 2:
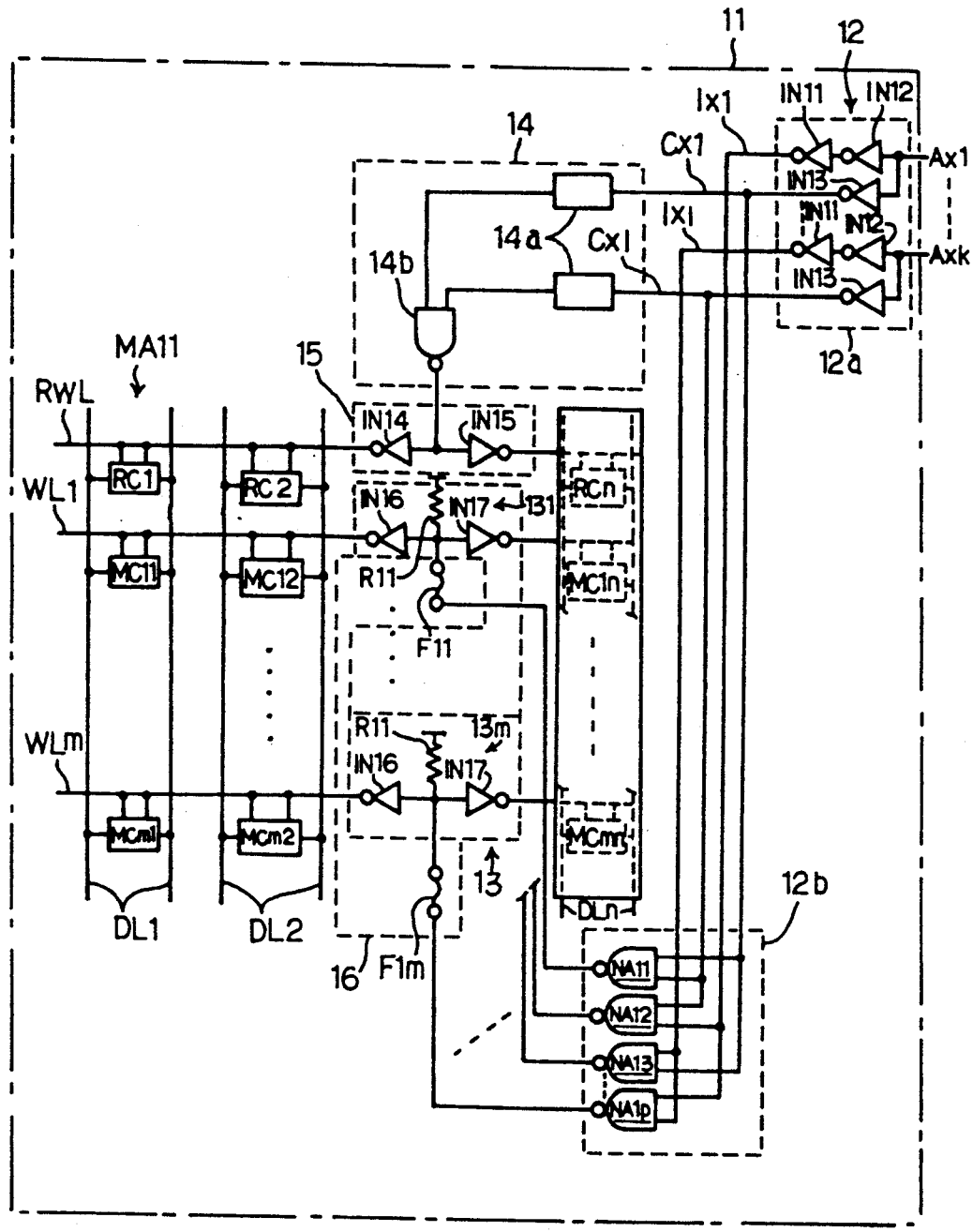
FIG. 2 is a circuit diagram showing the arrangement of a semiconductor memory device according to the present invention.

Referring to FIG. 2 of the drawings, a semiconductor memory device embodying the present invention is fabricated on a single semiconductor chip 11. The semiconductor memory device shown in FIG. 2 largely comprises a memory cell array MA11, a plurality of word lines WL1 to WLm, a word line designating unit 12, a word line driving unit 13, a programming unit 14, a redundant word line driving unit 15, and a breaker unit 16.

The memory cell array MA11 is implemented by a plurality of regular memory cells MC11, MC12, MC1n, MCm1, MCm2 and MCmn as well as redundant memory cells RC1, RC2 and RCn arranged in rows and columns, and the word lines WL1 to WLm are coupled to the rows of the regular memory cells MC11 to MCmn, respectively. The row of redundant memory cells RC1 to RCn is coupled to a redundant word line RWL, and the columns of regular memory cells MC11 to MCmn and the redundant memory cells RC1 to RCn are coupled to digit line pairs DL1 to DLn, respectively. Though not shown in FIG. 2 the digit line pairs DL1 to DLn are coupled to a column selecting unit which in turn is coupled to a data output unit. In this instance, the regular memory cells MC11 to MCmn and the redundant memory cells RC1 to RCn are of a static random access memory type. If a defective memory cell is incorporated in one of the rows of regular memory cells MC11 to MCmn, that row of regular memory cells is replaced with the row of redundant memory cells RC1 to RCn.

The word line designating unit 12 comprises an address input buffer circuit 12a and a row address decoding circuit 12b, and the address input buffer circuit 12a is supplied with external address bits Ax1 to Axk. The address input buffer circuit 12a comprises a plurality of inverting circuit groups equal in number to the external address bits Ax1 to Axk. Each of the inverting circuit groups has two inverting circuits IN11 and IN12 coupled in series to an input node of the associated external address bit, and a single inverting circuit IN13 coupled in parallel to the two inverting circuits IN11 and IN12. The plurality of inverting circuit groups thus arranged produce internal address signals Ix1 to Ixl and complementary address signals Cx1 to Cxl. All of the internal address signals Ix1 to Ixl and the complementary address signals Cx1 to Cxl are directly supplied to the row address decoding circuit 12b. The row address decoding circuit 12b is implemented by a plurality of NAND gates NA11 NA12, NA13, ... and NA1p, and the internal address signals Ix1 to Ixl and the complementary address signals Cx1 to Cxl are selectively supplied to NAND gates NA11 to NA1p so that one of the NAND gates NA11 to NA1p produces a decoded signal of a low voltage level.

The programming unit 14 comprises a programming circuit 14a and a NAND gate 14b, and the programming circuit 14a monitors the complementary address signals Cx1 to Cxl to check whether or not a row of regular memory cells with a defective memory cell is designated by the external address bits Ax1 to Axk. For this purpose, the complementary address signals Cx1 to Cxl are supplied to the programming circuit 14a, and the programming circuit 14a produces output signals of a high voltage level upon access to the defective memory cell. A semiconductor manufacturer programs the programming circuit 14a only when a defective memory cell is found before delivery, and the row address of the defective memory cell is permanently memorized in the programming circuit 14a. However, if no defective memory cell is found, the programming circuit 14a never produces the output signals simultaneously in the high voltage level. If a regular memory cell can not store a data bit, that regular memory cell is considered as a defective memory cell.

The NAND gate 14b is coupled to the redundant word line driving circuit 15, and the redundant word line driving circuit 15 comprises two inverting circuits IN14 and IN15 for driving the redundant word line RWL. If the output signals of the programming circuit 14a are in the high voltage level corresponding to logic "1" level, NAND gate 14b yields a first controlling signal of logic "0" level, and the redundant word line driving circuit 15 drives the redundant word line RWL to an active high voltage level. With the active high voltage level on the redundant word line RWL, the redundant memory cells RC1 to RCn concurrently turn on to conduct with the associated digit line pairs DL1 to DLn, respectively.

The word line driving unit 13 comprises a plurality of word line driving circuits 131 to 13m associated with word lines WL1 to WLm, respectively and each of the word line driving circuits 131 to 13m has two inverting circuits IN16 and IN17 coupled to its associated word line, and a resistive element R11 coupled between a source of power voltage level and the cathodes of the inverting circuits IN16 and IN17. The breaker unit 16 comprises fuse elements F11 to F1m coupled between NAND gates NA11 to NA1p, respectively and the respective inverting circuits IN16 and IN17 of word line driving circuits 131 to 13m. In this instance, the fuse elements F11 to F1m serve as breakable elements, the resistance of each fuse element is extremely low. If a defective memory cell is found in the regular memory cell array MA11, the fuse element associated with that defective memory cell is broken so that the associated word line driving circuit is isolated from the row address decoding circuit 12b. Since the power voltage level is supplied through the resistive element R11 to the cathodes of the inverting circuits IN16 and IN17, the word line coupled to the defective memory cell remains in the inactive low voltage level at all times. However, if no defective memory cell is found, no fuse element is broken, and one of the fuse elements F11 to F1m propagates the decoded signal to the associated word line driving circuits.

Description is hereinbelow made on circuit behavior of the semiconductor memory device in detail. If no defective memory cell is incorporated in the memory cell array MA11, the programming circuit 14a never allows the NAND gate 14b to produce the first controlling signal of the low voltage level, and, accordingly, the redundant word line driving circuit 15 causes the redundant word line RWL to remain in the inactive low voltage level. Therefore, the redundant memory cells RC1 to RCn keep off at all times. In this situation, all of the fuse elements F11 to F1m respectively interconnect the NAND gates NA11 to NA1p and the word line driving circuits 131 to 13m. Assuming that the external address bits Ax1 to Axk are indicative of the address assigned to the row of the regular memory cells MC11 to MC1n, the address input buffer circuit 12a produces the internal address signals Ix1 to Ixl and the complementary address signals Cx1 to Cxl, and the complementary address signals Cx1 and Cxl are in the high voltage level or logic "1" level. Then, the NAND gate NA11 produces the decoded signal of logic "0" level or the low voltage level, and the decoded signal is propagated through the fuse element F11 to the word line driving circuit 131. The inverting circuits IN16 and In17 of the word line driving circuit 131 drive the word line WL1 to the high voltage level, and data bits are read out from the regular memory cells MC11 to MC1n to the digit line pairs DL1 to DLn, respectively. One of the data bits is selected by the column selecting unit (not shown), and the data output unit (not shown) produces an output data signal indicative of the data bit. If another row of the regular memory cells is selected by the external address bits, the above mentioned sequence is traced for the row of the regular memory cells. The fuse element F11 is so low in resistance that time delay introduced in the signal propagation can be ignored. In these circumstances, the access speed is dominated by the address input buffer circuit 12a, the row address decoding circuit 12b and the word line driving circuit 13m. No delay circuit is provided in the signal path from the address input buffer circuit 12a and to the row address decoding circuit 12b, and, for this reason, the access speed is surely improved in comparison with the prior art semiconductor memory device.

Assuming now that a defective memory cell is found in the row of the regular memory cells MCm1 to MCmn, the row of the regular memory cells MCm1 to MCmn is replaced with the redundant memory cells RC1 to RCn, and the row address assigned to the regular memory cells MCm1 to MCmn is memorized in the programming circuit 14a. Moreover, the fuse element F1m is broken so that the word line driving circuit 13m is isolated from the row address decoder circuit 12b. If the external address bits Ax1 to Axk are indicative of the row address assigned to the regular memory cells MCm1 to MCmn, the address input buffer circuit 12a produces the internal address signals Ix1 to Ixk and the complementary address signals Cx1 to Cxk, and the internal address signals Ix1 to Ixk are in the high voltage level. The programming circuit 14a is supplied with the complementary address signals Cx1 to Cxk of the low voltage level, and produces the output signals of the high voltage level or logic "1" level. With the output signals of logic "1" level, the NAND gate 14b produces the first controlling signal of logic "0" level or the low voltage level, and the redundant word line driving circuit 15 drives the redundant word line RWL to the active high voltage level. Data bits are read-out from the redundant memory cells RC1 to RCn to the digit line pairs DL1 to DLn. On the other hand, the internal address signals Ix1 to Ixk and the complementary address signals Cx1 to Cxk are supplied to the row address decoder circuit 12b without any time delay, and cause the NAND gate NA1p to produce the decoded signal of the low voltage level. However, the decoded signal can not reach the word line driving circuit 13m, because the fuse element F1m has been already broken. Therefore, the inverting circuit IN16 and IN17 of the word line driving circuit 13m keep the word line WLm in the inactive low voltage level. When the row of the regular memory cells MCm1 to MCmn is accessed, the decoded signal is never supplied to the associated word line driving circuit 13m, and, for this reason, any error bit is not read out from the defective memory cell to the associated digit line pair. This results in reliability of the semiconductor memory device without sacrifice of the access speed.

When the semiconductor memory device enters a write-in mode, a data bit is written into a regular memory cell or a redundant memory cell. However, the sequence and the advantage are similar to the read out mode of operation, and no further description is incorporated for the sake of simplicity.

As will be understood from the foregoing description, the semiconductor memory device is improved in access speed without sacrifice of the reliability by virtue of the breaker unit 16. Since any word line deactivation unit and any delay circuit are not necessary in the semiconductor memory device according to the present invention, the circuit arrangement is simpler than the prior art semiconductor memory device.

Although particular embodiments of the present invention have been shown and described, it will be obvious to those skilled in the art that various changes and modifications may be made without departing from the spirit and scope of the present invention. For example, the regular and the redundant memory cells may be of a dynamic random access memory or of an electrically programmable read only memory. Moreover, more than one row of redundant memory cells may be provided in a semiconductor memory device for rescuing the semiconductor memory device from defective memory cells located over more than one row of the regular memory cells. The breakable elements are not limited to fuse elements. A diode and another permanently broken element may be used as the breakable element.

What is claimed is:

1. A semiconductor memory device fabricated on a single semiconductor ship, comprising:
   a) a plurality of regular memory cells arranged in rows and columns and storing data bits, respectively;
   b) a plurality of word lines respectively coupled to said rows of said regular memory cells and selectively driven to an active level so as to allow data bits to be read out from said regular memory cells of the associated row;
   c) a word line designating unit responsive to external address bits and producing a decoded signal for designating one of said plurality of word lines;
   d) a word line driving unit having a plurality of word line driving circuits associated with said word lines, respectively, and driving one of said plurality of word lines designated by said decoded signal to said active level, each of said word line driving circuits comprising d-1), a first inverter having an input node coupled through an associated breakable element to said word line designating unit, and an output node coupled to a first part of said associated word line, d-2) a second inverter having an input node coupled through said associated breakable element to said word line designating unit, and an output node coupled to a second part of said associated word line, and d-3) a resistive element coupled between a source of power voltage level and the input nodes of said first and second inverters;
   e) at least one row of redundant memory cells coupled to a redundant word line and capable of storing data bits, respectively, one of said rows of said regular memory cells being replaced with said at least one row of redundant memory cells when said one of said rows of said regular memory cells contains a defective memory cell;
   f) a programming unit operative to see whether or not said one of said rows of said regular memory cells is accessed, said programming unit producing a first controlling signal upon an access to said one of said rows of said regular memory cells;
   g) a redundant word line driving unit responsive to said first controlling signal, and driving said redundant word line to said active level for allowing said data bits to be read out from at least one row of said redundant memory cells; and
   h) a breaker unit having a plurality of said breakable elements provided in association with said plurality of word line driving circuits, respectively, and coupled between said word line designating unit and said plurality of word line driving circuits, one of said breakable elements associated with said one of said rows of said regular memory cells being broken so as to electrically isolate said associated word line driving circuit from said word line designating unit.

2. A semiconductor memory device as set forth in claim 1, in which each of said breakable elements is implemented by a fuse element.

3. A semiconductor memory device as set forth in claim 2, in which said word line designating unit comprises c-1) an address input circuit supplied with said external address bits for producing internal address signals and complementary address signals opposite in logic level to said internal address signals, and c-2) a row address decoding circuit supplied with said internal address signals and said complementary address signals for producing a decoded signal.

4. A semiconductor memory device as set forth in claim 3, in which said programming unit comprises f-1) a programming circuit memorizing an address assigned to said one of said rows of said regular memory cells containing said defective memory cell, and producing output signals when said complementary address signals indicate said address, and f-2) a logic gate supplied with said output signals from said programming circuit, and producing said first controlling signal.

5. A semiconductor memory device as set forth in claim 4, in which said redundant word line driving unit comprises inverting means having an input node supplied with said first controlling signal for driving said redundant word line with the complementary signal of said first controlling signal.

* * * * *